US011911863B2

(12) United States Patent
Ozawa

(10) Patent No.: US 11,911,863 B2
(45) Date of Patent: Feb. 27, 2024

(54) ATTACHMENT AND DETACHMENT DEVICE

(71) Applicant: CREATIVE TECHNOLOGY CORPORATION, Kawasaki (JP)

(72) Inventor: Masaru Ozawa, Kawasaki (JP)

(73) Assignee: CREATIVE TECHNOLOGY CORPORATION, Kawasaki (JP)

( * ) Notice: Subject to any disclaimer, the term of this patent is extended or adjusted under 35 U.S.C. 154(b) by 0 days.

(21) Appl. No.: 17/624,746

(22) PCT Filed: Aug. 31, 2020

(86) PCT No.: PCT/JP2020/032823
§ 371 (c)(1),
(2) Date: Jan. 4, 2022

(87) PCT Pub. No.: WO2021/049342
PCT Pub. Date: Mar. 18, 2021

(65) Prior Publication Data
US 2022/0258293 A1 Aug. 18, 2022

(30) Foreign Application Priority Data

Sep. 11, 2019 (JP) ................................. 2019-165250

(51) Int. Cl.
*H02N 13/00* (2006.01)
*B23Q 3/15* (2006.01)
*H01L 21/683* (2006.01)

(52) U.S. Cl.
CPC ............ *B23Q 3/15* (2013.01); *H01L 21/6833* (2013.01); *H02N 13/00* (2013.01); *B23Q 2703/02* (2013.01)

(58) Field of Classification Search
CPC ...... H02N 13/00; B23Q 3/15; H01L 21/6833; H01L 21/68785; H01L 21/6831; H01L 21/687

(Continued)

(56) References Cited

U.S. PATENT DOCUMENTS 6,122,159 A 9/2000 Arai et al.
6,259,592 B1* 7/2001 Ono ..................... H01L 21/6831
279/128

(Continued)

FOREIGN PATENT DOCUMENTS

JP 6-196548 A 7/1994
JP 11-176920 A 7/1999

(Continued)

OTHER PUBLICATIONS

English translation of the Japanese Notice of Reasons for Refusal for Japanese Application No. 2021-518676, dated Nov. 30, 2021.
International Search Report for PCT/JP2020/032823 (PCT/ISA/210) dated Nov. 24, 2020.

(Continued)

*Primary Examiner* — Danny Nguyen
(74) *Attorney, Agent, or Firm* — Birch, Stewart, Kolasch & Birch, LLP

(57) ABSTRACT

An attachment and detachment device that excels in responsiveness to attachment and detachment of a workpiece even when the workpiece is thin while utilizing an electrostatic chuck method is provided. The attachment and detachment device that enables suction and separation of a workpiece includes a machinable ceramic layer, an adhesion activating layer provided on the machinable ceramic layer, an electrode layer provided on the adhesion activating layer, and a dielectric layer provided on the electrode layer, wherein the electrode layer is covered with the adhesion activating layer and the dielectric layer, and the dielectric layer has a volume resistivity of $10^9$ to $10^{12}$ Ω·cm.

14 Claims, 2 Drawing Sheets

(58) Field of Classification Search
USPC .......................................................... 361/234
See application file for complete search history.

(56) References Cited

U.S. PATENT DOCUMENTS

| | | | | |
|---|---|---|---|---|
| 6,351,367 | B1* | 2/2002 | Mogi | .................... B25B 11/002 |
| | | | | 29/829 |
| 7,468,880 | B2* | 12/2008 | Itakura | ................ H01L 21/6831 |
| | | | | 361/234 |
| 2004/0168640 | A1 | 9/2004 | Muto et al. | |
| 2005/0215073 | A1* | 9/2005 | Nakamura | ........ H01L 21/67109 |
| | | | | 438/778 |
| 2006/0268491 | A1 | 11/2006 | Itakura et al. | |
| 2010/0002355 | A1* | 1/2010 | Morooka | .......... H01L 21/67069 |
| | | | | 361/234 |
| 2013/0153147 | A1 | 6/2013 | Senzaki et al. | |
| 2014/0346152 | A1* | 11/2014 | Sasaki | ............... H01J 37/32715 |
| | | | | 219/121.58 |
| 2016/0133782 | A1* | 5/2016 | Thirunavukarasu | ......................... |
| | | | | H01L 21/68771 |
| | | | | 118/500 |
| 2021/0057257 | A1* | 2/2021 | Cho | .................... C04B 41/4527 |

FOREIGN PATENT DOCUMENTS

| | | |
|---|---|---|
| JP | 2003-45952 A | 2/2003 |
| JP | 2004-79861 A | 3/2004 |
| JP | 2006-156550 A | 6/2006 |
| JP | 2007-194393 A | 8/2007 |
| JP | 2010-18853 A | 1/2010 |
| JP | 2010-165805 A | 7/2010 |
| JP | 2013-149935 A | 8/2013 |
| KR | 10-2007-0106782 A | 11/2007 |

OTHER PUBLICATIONS

Written Opinion of the International Searching Authority for PCT/JP2020/032823 (PCT/ISA/237) dated Nov. 24, 2020.

* cited by examiner

[Fig. 1]
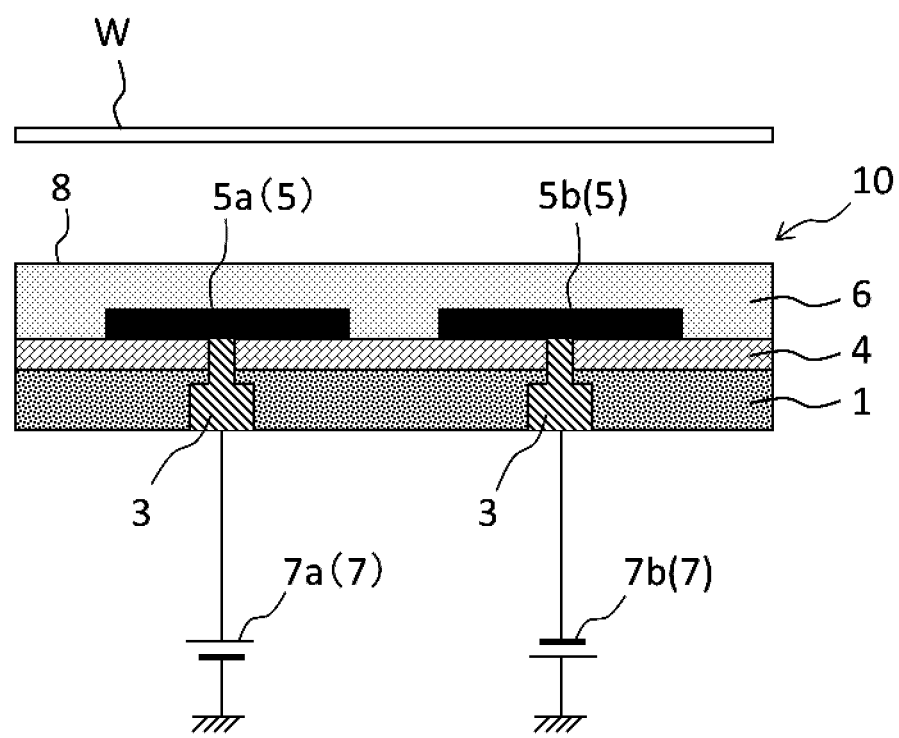

[Fig. 2]
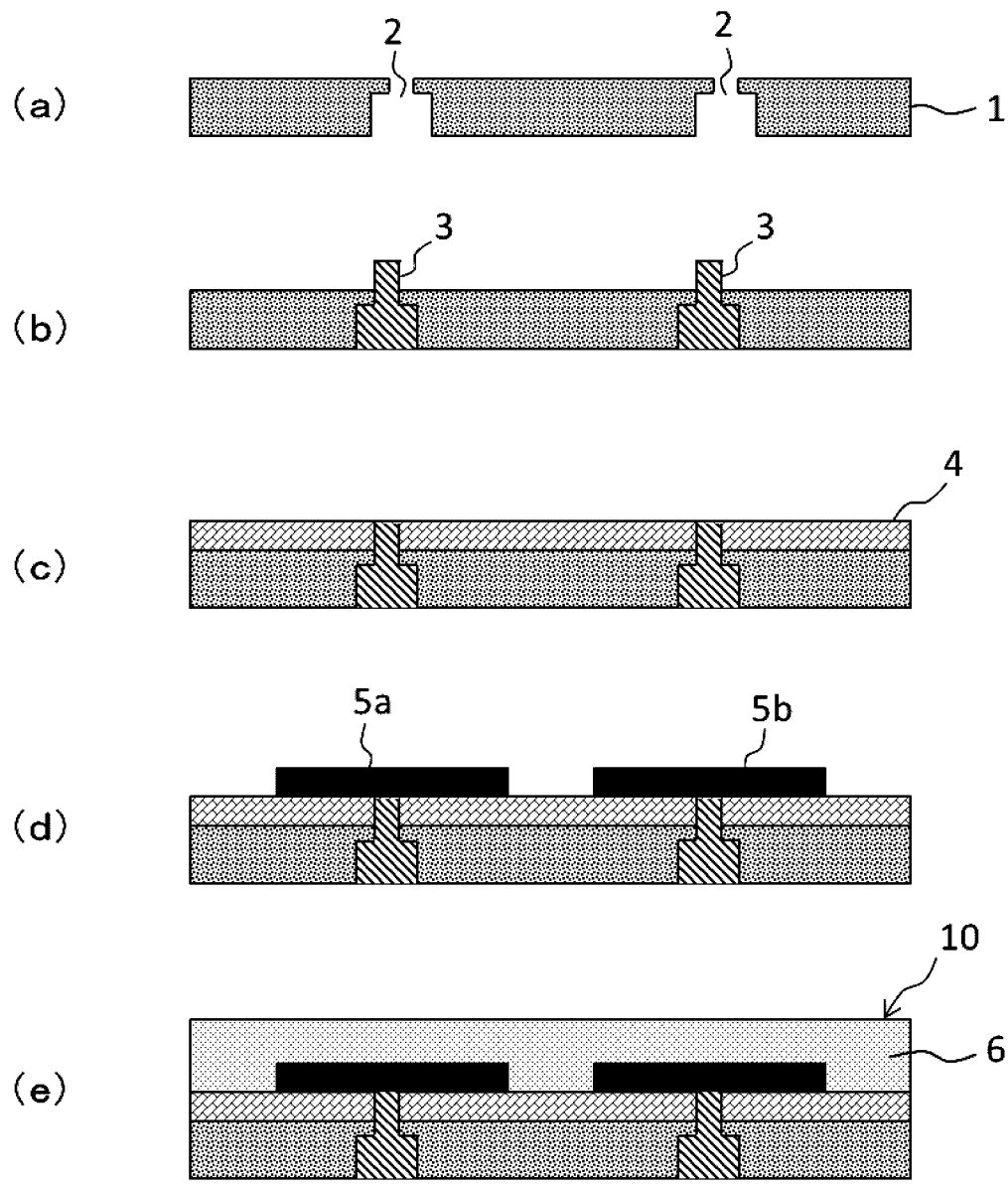

ATTACHMENT AND DETACHMENT DEVICE

TECHNICAL FIELD

The present invention relates to an attachment and detachment device with which suction and separation (these may be collectively referred to as attachment and detachment) of a workpiece can be performed, and more specifically relates to an attachment and detachment device which is excellent in responsiveness when a workpiece is attached and detached and which is particularly suitable for handling a thin workpiece.

BACKGROUND ART

As an attachment and detachment device for attaching and detaching a workpiece, a vacuum chuck using vacuum suction, an electrostatic chuck using electrostatic attraction force, and the like are known, and use of these is selected properly in accordance with a usage environment and a type of a workpiece.

That is, since the vacuum chuck method provides an excellent suction holding force and also elicits excellent response characteristics (responsiveness) to attachment and detachment of a workpiece, a workpiece attachment and detachment device using the vacuum chuck method is generally in wide use. However, in a case in which a workpiece is processed in a vacuum environment, the workpiece cannot be held by vacuum suction in the first place. Further, if a workpiece itself such as a lead frame or a mask has a hole or a gap, vacuum suction cannot be performed. In addition, in a case of a workpiece having a thin thickness such as a film or foil, the workpiece may bend at a suction point and a suction mark may remain on the workpiece, and thus the vacuum chuck method is not suitable.

On the other hand, the electrostatic chuck method is suitable in a vacuum environment, in which the vacuum chuck method cannot be applied, or in the case of a workpiece having a hole. For example, there is known an attachment and detachment device that includes an insulating material on a base member, in which a pair of electrodes are embedded, and sucks and holds a semiconductor chip or an insulating film using an electrostatic attraction force (see PTL 1).

CITATION LIST

Patent Literature

[PTL 1] Japanese Patent Application Laid-open No. 2006-156550

SUMMARY OF INVENTION

Technical Problem

In manufacturing thin and high-performance electronic devices such as smartphones and wearable terminals, not only mounting components such as lead frames and materials thereof, but also manufacturing-related components such as metal masks have been made lighter, thinner, shorter and smaller. For that reason, from the above viewpoint, it can be said that a demand for workpiece transfer using the electrostatic chuck method is increasing.

However, in an attachment and detachment device using the electrostatic chuck method, residual charge at the time of separation after sucking a workpiece becomes a problem. In particular, in a workpiece having a thin thickness such as a lead frame or a metal foil, separation (removal) of the workpiece may be difficult even with slight residual charge. The same problem of such residual charge occurs when a silicon wafer is sucked and separated in a plasma etching device. For example, after a DC voltage is turned off, a static elimination process of, for example, applying the opposite voltage to a suction electrode or discharging plasma is performed, but in the attachment and detachment device used for a workpiece transfer device as described above, plasma discharge may not be easily performed, or in consideration of a processing speed for workpiece transfer and the like, it may not be realistic to apply the static elimination process every time the workpiece is transferred.

Therefore, as a result of diligent studies on the problem of residual charge, which is a conventional problem, the present inventors have found that by using an attachment and detachment device including a machinable ceramic layer, an adhesion activating layer, an electrode layer, and a dielectric layer having a volume resistivity of a predetermined value, the residual charge after a voltage applied to the electrode layer is turned off can be further reduced, and thus separation (removal) of the workpiece can be smoothly performed even if the workpiece is thin, and thereby completed the present invention.

Therefore, an object of the present invention is to provide an attachment and detachment device using an electrostatic chuck method which is suitable for use in a case of a workpiece having a thin thickness that cannot be vacuum-sucked or a workpiece having a hole and which excels in responsiveness to attachment and detachment of the workpiece.

Solution to Problem

That is, the present invention is an attachment and detachment device enabling suction and separation of a workpiece, the device including a machinable ceramic layer, an adhesion activating layer provided on the machinable ceramic layer, an electrode layer provided on the adhesion activating layer, and a dielectric layer provided on the electrode layer, and characterized in that the electrode layer is covered with the adhesion activating layer and the dielectric layer, and the dielectric layer has a volume resistivity of $10^9$ to $10^{12}$ $\Omega\cdot$cm.

In the present invention, as the attachment and detachment device with which suction and separation of the workpiece can be performed, a device including the dielectric layer having a volume resistivity of $10^9$ to $10^{12}$ $\Omega\cdot$cm is used. Since the dielectric layer has such a volume resistivity (volume specific resistivity), it is possible to make the attachment and detachment device that uses a so-called Johnson-Labeck force. That is, by applying a low voltage to the electrode layer with the attachment and detachment device including the dielectric layer having a relatively low volume resistivity, charge is accumulated on the dielectric layer forming a workpiece suction surface and a surface of the workpiece, and thus the workpiece can be sucked. Further, when the voltage applied to the electrode layer is turned off, the dielectric layer acts as a resistor for releasing the voltage applied to the electrode layer, thereby enabling rapid charge neutralization, and thus the charge is more likely to disappear as compared with a case in which a Coulomb force generated between the workpiece and the electrode layer is used, whereby responsiveness to suction and separation of the workpiece can be improved.

The dielectric layer is preferably formed by a ceramic sprayed film. That is, the ceramic sprayed film forming the dielectric layer is not particularly limited as long as the volume resistivity is within the above range, but in order to improve wear resistance in consideration of bite of a foreign matter intervening between the dielectric layer forming the workpiece suction surface and the workpiece, specifically, an aluminum oxide-based ceramic sprayed film is preferable, and more specifically, an aluminum oxide-based ceramic sprayed film containing titanium oxide is preferable for the volume resistivity set to be within a predetermined range. Further, the Vickers hardness of the dielectric layer when formed by a ceramic sprayed film is preferably 750 to 1,000.

Further, the electrode layer of the attachment and detachment device in the present invention need only to be formed as a so-called internal electrode, and a material and a forming means thereof are not particularly limited. For example, in addition to forming a sprayed film made of conductive ceramics or an electrode layer made of a metal sprayed film, screen printing using a conductive paste can be exemplified. Among these, in consideration of adhesion and the like, a sprayed film made of conductive ceramics or an electrode layer made of a metal sprayed film is preferable. In that case, considering a stress due to heat during manufacturing of the electrode layer, the material preferable that has a coefficient of linear expansion close to that of the dielectric layer, the machinable ceramic layer, or the adhesion activating layer added as needed, and thus tungsten, molybdenum, titanium, or alloys thereof are preferably used.

The electrode layer may be a unipolar electrode or a bipolar electrode to which voltages having different polarities are applied. In the case of a unipolar electrode, the workpiece can be attached and detached by applying voltages having different polarities to each electrode. Among these, the electrode layer is preferably a bipolar electrode to which voltages having different polarities are applied. Shapes of these electrodes are not particularly limited, and for example, in the case of a bipolar electrode, the bipolar electrode may be formed by disposing, among a pair of electrodes having shapes of comb teeth, the comb teeth of a positive application electrode, to which a positive voltage is applied, and the comb teeth of a negative application electrode, to which a negative voltage is applied, to be alternately arranged, or a pair of rectangular or semicircular electrodes may be arranged at a predetermined interval to form a bipolar electrode with one as a positive electrode and the other as a negative electrode. In the case of a unipolar electrode, a range of shape of the workpiece may be covered as much as possible by two or more electrodes and is not particularly limited.

Further, in the attachment and detachment device of the present invention, the electrode layer may have a plurality of partitioned regions partitioned in an array. That is, the electrode layer serving as an internal electrode may include a unipolar electrode to correspond to each partitioned region, or a bipolar electrode to correspond to each partitioned region and the unipolar electrode or the bipolar electrode in each partition region may be individually provided with a power supply terminal for supplying electric power from outside. As a result, on the workpiece suction surface that sucks the workpiece, it is possible to select the electrode (unipolar electrode or bipolar electrode) to be operated in accordance with a size and a shape of the workpiece, and thus the workpiece can be efficiently sucked without waste and the workpiece can be separated more smoothly because no extra charge is generated.

In addition, in the present invention, the electrode layer may be provided with a ground to release the charged charge, and when the workpiece is separated, the electrode layer may be discharged by dropping to the ground. Further, after the power supply is turned off to stop applying the voltage to the electrode layer, the opposite voltage is applied by applying a voltage having an opposite polarity to the applied voltage, in order to ensure more stable operation, and switching of the power output polarity may be performed such that the polarity of the voltage applied to the electrode layer is exchanged each time the workpiece is sucked.

Further, the attachment and detachment device in the present invention includes the machinable ceramic layer as a base member. In general, machinable ceramics are easier to process and relatively cheaper than engineering ceramics made of ordinary sintered ceramics.

A material of the machinable ceramic that forms such a machinable ceramic layer is not particularly limited, and examples thereof include ones made of a material such as boron nitride or a composite material of boron nitride and silicon nitride, ones made of a material such as a composite material of aluminum nitride and boron nitride, composite mica ceramics with a vitreous matrix, etc. Also, examples of commercially available products include Macor (registered trademark) manufactured by NTK CERATEC Co., Ltd., Maseraito series manufactured by Krosaki Harima Corporation, and Photoveel series manufactured by Ferrotec Ceramics Corporation.

Further, the attachment and detachment device in the present invention includes the adhesion activating layer on the machinable ceramic layer. That is, the electrode layer is provided on the machinable ceramic layer via the adhesion activating layer. Such an adhesion activating layer serves as an adhesion activating layer when the electrode layer or the dielectric layer is laminated on the machinable ceramic layer and also has a function of reducing residual charge.

Among these, regarding the former function, by providing the adhesion activating layer on the machinable ceramic layer, during the film formation of the electrode layer and the dielectric layer, peeling of these films due to heat can be prevented, and peeling due to residual stress of the films can be prevented. In addition, the presence of the adhesion activating layer also forms an anchor that exhibits superior adhesion compared to when the machinable ceramic layer is blasted. On the other hand, regarding the latter function, the electrode layer is covered with the dielectric layer and the adhesion activating layer, and thus in a case in which a low voltage applied to the electrode layer is a direct current (DC) of about ±500 V or less, the residual charge at the time of separating the workpiece can be further reduced. In that case, of course, it is preferable that the volume resistivity of the adhesion activating layer be as low as $10^9$ to $10^{12}$ $\Omega \cdot cm$, but a relatively high volume resistivity such as $10^{14}$ to $10^{16}$ $\Omega \cdot cm$ may be used. However, when a high voltage of DC±750 V or more is applied to the electrode layer, the dielectric layer preferably has a low volume resistivity such as $10^9$ to $10^{12}$ $\Omega \cdot cm$.

Here, a material for forming the adhesion activating layer and a forming means thereof are not particularly limited, but from the viewpoint of the latter function of the adhesion activating layer described above, an aluminum oxide-based ceramic sprayed film containing titanium oxide may be used as the adhesion activating layer, as in the case of the ceramic sprayed film forming the dielectric layer. On the other hand, from the viewpoint of the former function, the adhesion activating layer may have a low volume resistivity of about $10^9$ to $10^{12}$ $\Omega \cdot cm$ due to an aluminum oxide-based ceramic sprayed film containing titanium oxide, or the adhesion activating layer may be an aluminum oxide-based layer having a volume resistivity of $10^{14}$ to $10^{16}$ Ω·cm, which is relatively high, without containing titanium oxide. In addition, as described above, since the highly processable machinable ceramic is formed due to bonding of various particles of the vitreous matrix, it is easy to roughen the surface by blasting. For that reason, it is also convenient for achieving adhesion with the adhesion activating layer, and especially, in a case in which the adhesion activating layer is made of a sprayed film, the vitreous material contained in the machinable ceramic is also considered to enhance the adhesion with these sprayed films. That is, since the vitreous material easily forms a silicide-based compound, stronger adhesion can be obtained, for example, between Al of aluminum oxide and $SiO_2$ contained in the machinable ceramics.

Further, in a case in which at least one of the dielectric layer, the electrode layer, and the adhesion activating layer in the attachment and detachment device of the present invention is formed by a thermal spray film, it is preferable to perform pore sealing processing with a resin. The sprayed film generally has a lamellar structure in which molten particles collide with a spraying target and are flattened and deposited. For that reason, there are voids at an interface of the flattened and deposited particles, and these voids form open pores in the sprayed film. When moisture is trapped inside the pores, it may cause deterioration of insulating characteristics of the sprayed film and fluctuation in electrical resistance, and may cause fluctuation of volume resistivity due to humidity. Therefore, in order to avoid these issues, it is preferable to seal the holes with a resin. A type of resin is not particularly limited, and for example, epoxy resin, silicone, water glass, acrylic resin, and the like can be used. In particular, from the viewpoint of avoiding the intrusion of moisture into a product from the outside through the open pores, it is preferable that at least the dielectric layer include a sealing hole subjected to hole sealing processing with a resin, and preferably, that both the dielectric layer and the electrode layer include sealing holes. Further, from the viewpoint of reducing the risk of fluctuation in volume resistivity due to moisture absorption, it is preferable that the adhesion activating layer also be provided with a sealing hole.

The workpiece attached and detached by the attachment and detachment device in the present invention preferably has a thickness of 0.001 to 1.5 mm. A type of the workpiece is not particularly limited, and it may be in the form of a flake, foil, paper, a film, or the like, and for example, conductors such as metal frames, precious metal foils, or non-ferrous metal foils, semiconductors such as silicon wafers, gallium nitride substrates, or germanium substrates, paper bodies, or insulators can be exemplified. In particular, since the attachment and detachment device of the present invention can further reduce the residual charge than a conventional one, it can be said that a thickness of the workpiece described above is preferably 0.001 to 0.3 mm, more preferably 0.001 to 0.15 mm, and the workpiece is preferably made of a conductor or a semiconductor.

Advantageous Effects of Invention

According to the attachment and detachment device of the present invention, residual charge after the power supply is turned off to stop the voltage application to the electrode layer can be further reduced. For that reason, it can be said that responsiveness to attachment and detachment of the workpiece is excellent, and thus the attachment and detachment device of the present invention is particularly suitable for workpiece transfer accompanied by attachment and detachment of a thin workpiece.

BRIEF DESCRIPTION OF THE DRAWINGS

FIG. 1 is a schematic explanatory cross-sectional view showing an example of an attachment and detachment device in a workpiece transfer device of the present invention.

FIG. 2 is a schematic explanatory diagram showing a manufacturing procedure of the attachment and detachment device according to the present invention.

DESCRIPTION OF EMBODIMENTS

Hereinafter, the present invention will be described with reference to the figures.

FIG. 1 shows an example of an attachment and detachment device of the present invention. The attachment and detachment device 10 according to the present example includes a machinable ceramic layer 1 made of machinable ceramics, an adhesion activating layer 4 which is formed of a second ceramic sprayed film on the machinable ceramic layer 1, an electrode layer 5 (5a and 5b) formed of a metal sprayed film, and a dielectric layer 6 which is formed of a first ceramic sprayed film to cover the electrode layer 5, and the dielectric layer 6 has a volume resistivity of $10^9$ to $10^{12}$ Ω·cm. Further, an external DC power supply 7 (7a and 7b) is connected to the electrode layer 5 via a power supply terminal 3. In the example of FIG. 1, an electrode 5a is a positive electrode, an electrode 5b is a negative electrode, and these constitute bipolar electrodes. Also, although an example of an attachment and detachment device having a set of bipolar electrodes is shown here, it may be configured such that the electrode layer 5 has a plurality of partitioned regions partitioned in an array, and each bipolar electrode (or unipolar electrode) corresponding to each partitioned region is provided, so that electrodes to be operated can be selected in accordance with a shape of a workpiece W.

The workpiece W sucked and separated by the attachment and detachment device 10 is a conductor, a semiconductor, or an insulator having a thickness of 0.001 to 1.5 mm. For example, a lead frame used when a semiconductor package such as an LSI is manufactured is made of a conductor such as a Cu alloy and has a thickness of about 0.01 to 1.5 mm. In the case of transferring (supplying) such a lead frame to a die bonding device or the like, it is generally performed at room temperature. Thus, if the attachment and detachment device 10 of the present invention is used for transferring such a lead frame, the dielectric layer 6 has a volume resistivity of the above value.

Further, the adhesion activating layer 4 in this case may have a volume resistivity of $10^9$ to $10^{12}$ Ω·cm as in the dielectric layer 6, and the volume resistivity may be set to $10^{14}$ to $10^{16}$ Ω·cm, which is relatively high, but the volume resistivity is preferably $10^9$ to $10^{12}$ Ω·cm from the viewpoint of reducing the residual charge when the power supply is turned off. In the case of sucking the lead frame as described above, a voltage of about DC±200 to 500 V may be applied respectively to the electrodes 5a and 5b, and in the case of requiring a higher suction force, or in a case in which the workpiece is thick or has some warpage, it is preferable that the volume resistivity of the adhesion activating layer 4 be $10^9$ to $10^{12}$ Ω·cm since a higher applied voltage is required (about DC±750 to 1,500 V).

As a method of obtaining such an attachment and detachment device 10, for example, it can be manufactured by the procedure as shown in FIG. 2. First, as shown in FIG. 2(a), a plate-shaped machinable ceramic is prepared, and if necessary, machining such as cutting or polishing to a predetermined size is performed thereon to prepare the machinable ceramic layer 1. In that case, the machining may be performed in accordance with a size and a shape of the lead frame to be sucked, and the thickness is not particularly limited, but it is preferably about 3 to 30 mm in consideration of handling and the like. Further, through holes 2 for fitting power supply terminals 3 for feeding the electrodes 5a and 5b may be prepared in advance. In that case, since the machinable ceramic itself is an insulator (generally, the volume resistivity is about $10^{14}$ to $10^{15}$ Ω·cm), it is not particularly necessary to attach a sleeve for the purpose of insulation.

Next, as shown in FIG. 2(b), the power supply terminals 3 are mounted into the through holes 2 formed in the machinable ceramic layer 1. In that case, while considering a thickness of the adhesion activating layer 4, tip portions of the power supply terminals 3 are made to protrude toward the electrode layer 5 so that they can be connected to the electrode layer 5. Further, in this case, a surface of the machinable ceramic layer 1 may be blasted.

Next, as shown in FIG. 2(c), the second ceramic sprayed film is sprayed to form the adhesion activating layer 4. In the case of the attachment and detachment device for attaching and detaching a lead frame, the thickness of the adhesion activating layer 4 is about 0.03 to 1.0 mm.

Next, as shown in FIG. 2(d), the metal sprayed film is sprayed to form the electrode layer 5. In that case, a part of the electrode may be removed so that the electrode layer 5 (electrodes 5a and 5b in the example of FIG. 2) having a predetermined shape is formed by performing masking processing in accordance with a shape of the electrode using a heat-resistant masking tape or a heat-resistant resist, etc., or using a method such as blasting after spraying the electrode layer without masking processing. Also, a thickness of each electrode forming the electrode layer 5 is about 0.03 to 0.15 mm, as in the previous case.

Next, as shown in FIG. 2(e), the first ceramic sprayed film is sprayed to cover the electrode layer 5 to form the dielectric layer 6. As in the previous case, as the thickness of the dielectric layer 6 here, it is preferable that the thickness of the dielectric layer 6 provided on a surface of the electrode layer 5 be about 0.1 to 1.0 mm.

Then, after the thermal spraying process is completed, the dielectric layer 6, the electrode layer 5, and the adhesion activating layer 4 are subjected to sealing processing, and a method thereof is not particularly limited and for example, impregnation processing may be performed using a resin solution having a predetermined solid content concentration. Next, the dielectric layer 6 is surface-polished, and if necessary, surface roughness is adjusted by wrapping or polishing, and thus the attachment and detachment device can be obtained.

EXAMPLES

Hereinafter, an example of the present invention will be described in more detail.

Four types of attachment and detachment devices were prepared as shown in Table 1 below in the present example. Devices 1 and 2 are attachment and detachment devices according to the example of the present invention. Devices 3 and 4 are comparative examples. Among them, the device 1 includes an electrode layer configured of two square electrodes having a size of 136 mm×8.15 mm×thickness 0.05 mm formed by a tungsten (W) sprayed film and a dielectric layer made of $Al_2O_3$—$TiO_2$ sprayed film of 140 mm×170 mm×thickness 0.3 mm on a machinable ceramic layer consisting of 140 mm×170 mm×thickness 9.65 mm Photoveel (a product name manufactured by Ferrotec Ceramics Corporation) via an adhesion activating layer made of an $Al_2O_3$—$TiO_2$ sprayed film having a size of 140 mm×170 mm×thickness 0.05 mm. Also, the device 2 is the same as the device 1 except that it includes an adhesion activating layer made of an $Al_2O_3$ sprayed film having a size of 140 mm×170 mm×thickness 0.05 mm. Further, the device 3 is the same as the device 1 except that the adhesion activating layer is not used. Furthermore, the device 4 uses a metal base material made of aluminum instead of the machinable ceramic layer and uses a polyimide film as the dielectric layer or the like. In addition, in attachment and detachment devices of these devices 1 to 3, the dielectric layer, the electrode layer, and the adhesion activating layer are sealed with a silicone impregnating agent. Also, the volume resistivities of the dielectric layer, the adhesion activating layer, and the machinable ceramic layer are as shown in the table (the volume resistivity is a value after the sealing processing).

TABLE 1

| Attachment and detachment device | Laminated structure | Material | Volume resistivity |
|---|---|---|---|
| Device 1 | Dielectric layer | $Al_2O_3$—$TiO_2$ sprayed film | $3.86 \times 10^{11}$ Ω · cm |
|  | Electrode layer | W sprayed film | (Conductor) |
|  | Adhesion activating layer | $Al_2O_3$—$TiO_2$ sprayed film | $3.86 \times 10^{11}$ Ω · cm |
|  | Machinable ceramic layer | Photoveel | $4,57 \times 10^{15}$ Ω · cm |
| Device 2 | Dielectric layer | $Al_2O_3$—$TiO_2$ sprayed film | $3.86 \times 10^{11}$ Ω · cm |
|  | Electrode layer | W sprayed film | (Conductor) |
|  | Adhesion activating layer | $Al_2O_3$ sprayed film | $5.78 \times 10^{15}$ Ω · cm |
|  | Machinable ceramic layer | Photoveel | $4.57 \times 10^{15}$ Ω · cm |
| Device 3 | Dielectric layer | $Al_2O_3$—$TiO_2$ sprayed film | $3.86 \times 10^{11}$ Ω · cm |
|  | Electrode layer | W sprayed film | (Conductor) |
|  | — | — | — |
|  | Machinable ceramic layer | Photoveel | $4.57 \times 10^{15}$ Ω · cm |
| Device 4 | Dielectric layer | Polyimide film | $9.67 \times 10^{16}$ Ω · cm |
|  | Electrode layer | Cu foil | (Conductor) |
|  | Insulating layer | Polyimide film | $9.67 \times 10^{16}$ Ω · cm |
|  | Metal base material | Aluminum | (Conductor) |

(Film Adhesion Force Test)

A film adhesion force was evaluated using a tensile tester for the attachment and detachment devices of the devices 1 to 3 prepared in the above. In the test, an epoxy adhesive was applied to a test area of ϕ8 mm of the dielectric layer forming a workpiece suction surface and fixed to the test area, and a tensile test was performed. The tensile test was performed three times for each device, and a value at which the film was peeled off was converted into an area to determine the adhesion force.

The results and positions of fracture surfaces are as shown in Table 2, and it was found that the adhesion force of the film was superior in the devices 1 and 2 as compared with the device 3. That is, it was confirmed that the adhesion force of the sprayed film was further improved by providing the adhesion activating layer.

TABLE 2

| Attachment and detachment device | Test | Adhesion force (MPa) | Average value (MPa) | Fracture surface |
|---|---|---|---|---|
| Device 1 | First | 12.3 | 11.8 | Adhesion activating layer-machinable ceramic layer |
|  | Second | 10.9 |  | Adhesion activating layer-machinable ceramic layer |
|  | Third | 12.1 |  | Adhesion activating layer-machinable ceramic layer |
| Device 2 | First | 12.5 | 12.3 | Adhesion activating layer-machinable ceramic layer |
|  | Second | 11.3 |  | Adhesion activating layer-machinable ceramic layer |
|  | Third | 13.2 |  | Adhesion activating layer-machinable ceramic layer |
| Device 3 | First | 7.4 | 7.6 | Electrode layer-machinable ceramic layer |
|  | Second | 6.9 |  | Electrode layer-machinable ceramic layer |
|  | Third | 8.5 |  | Electrode layer-machinable ceramic layer |

(Workpiece Dechuck Test)

A workpiece dechuck test was conducted on the devices 1 and 2 having an excellent film adhesion force to examine separation properties (dechuck properties) after sucking the workpiece. At that time, for comparison reference, the workpiece dechuck test was also performed on the device 4 using a polyimide film. As shown in Table 1 above, the device 4 uses polyimide films of 120 mm×120 mm×thickness 0.05 mm instead of the dielectric layer and the adhesion activating layer. In addition, the device 4 uses two square electrodes of 100 mm×100 mm×thickness 0.01 mm formed of a copper foil (Cu foil) as the electrode layer. Further, the device 4 uses an aluminum metal base material having a size of 120 mm×120 mm×thickness 5 mm instead of the machinable ceramic layer.

As the workpiece, a commercially available aluminum foil cut out to 80 mm×80 mm was used. Further, in order to suck the aluminum foil, a voltage of DC±300 V was applied to the electrode layers of the devices 1, 2, and 4. In the test, the aluminum foil was sucked with the workpiece suction surface facing downward in a vertical direction, and a time required for the aluminum foil to drop due to its own weight after the voltage was cut off (after turned off) was measured three times with each device.

The results are as shown in Table 3. In the devices 1 and 2, after the voltage applied to the electrode layer was cut off, the aluminum foil immediately dropped and showed good dechuck properties. On the other hand, in the device 4, the aluminum foil may not fall due to its own weight, and separation of the workpiece could not be controlled.

TABLE 3

| Attachment and detachment device | Test | Dechuck time (second) | Average value (second) |
|---|---|---|---|
| Device 1 | First | ≤1 | ≤1 |
|  | Second | ≤1 |  |
|  | Third | ≤1 |  |

TABLE 3-continued

| Attachment and detachment device | Test | Dechuck time (second) | Average value (second) |
|---|---|---|---|
| Device 2 | First | ≤1 | ≤1 |
|  | Second | ≤1 |  |
|  | Third | ≤1 |  |
| Device 3 | First | 3 | — |
|  | Second | Not peeled |  |
|  | Third | 6 |  |

(Static Elimination Property of Workpiece Suction Surface)

For the devices 1 and 2 having an excellent film adhesion force, a surface potential of the workpiece suction surface when a voltage of DC±300 V is applied to the electrode layer is measured, and the surface potential of the workpiece suction surface was measured after the voltage is turned off using a surface electrometer. At the same time, a decay time of the surface potential after the voltage was turned off was measured to evaluate static elimination properties on the workpiece suction surface.

The results are as shown in Table 4, and it was confirmed that charge on the workpiece suction surface was quickly eliminated within 1 second for all the devices.

TABLE 4

| Attachment and detachment device | Test | Applied voltage (V) | Measurement result in on-state (V) | Measurement result in off-state (V) | Decay time (second) |
|---|---|---|---|---|---|
| Device 1 | First | +300 | +320 to +340 | ≤±15 | ≤1 |
|  |  | −300 | −310 to −330 | ≤±15 |  |
|  | Second | +300 | +330 to +350 | ≤±15 |  |
|  |  | −300 | −320 to −340 | ≤±15 |  |
|  | Third | +300 | +330 to +350 | ≤±15 |  |
|  |  | −300 | −310 to −330 | ≤±15 |  |
| Device 2 | First | +300 | +310 to +340 | ≤±15 | ≤1 |
|  |  | −300 | −330 to −350 | ≤±15 |  |
|  | Second | +300 | +320 to +350 | ≤±15 |  |
|  |  | −300 | −320 to −350 | ≤±15 |  |
|  | Third | +300 | +310 to +350 | ≤±15 |  |
|  |  | −300 | −320 to −340 | ≤±15 |  |

(Static Elimination of Machinable Ceramic Layer)

Similarly, for the devices 1 and 2, a surface potential of the machinable ceramic layer when a voltage of DC±300 V is applied to the electrode layer was measured, and the surface potential of the machinable ceramic layer after the voltage is cut off was measured using a surface electrometer. At the same time, the decay time of the surface potential after the voltage was cut off was measured to evaluate the static elimination properties of the machinable ceramic layer.

The results are shown in Table 5, and it was confirmed that charge of the machinable ceramic layer was eliminated within 5 seconds in each device, and that the device 1 in particular had good static elimination properties. That is, all of them have good dechuck properties, and the charge on the workpiece suction surface is removed within 1 second, and thus it is considered that the dechuck properties of these devices 1 and 2 are extremely good.

TABLE 5

| Attachment and detachment device | Test | Applied voltage (V) | Measurement result in on-state (V) | Measurement result in off-state (V) | Decay time (second) |
|---|---|---|---|---|---|
| Device 1 | First | +300 | +320 to +340 | +40 to +60 | ≤5 |
|  |  | −300 | −310 to −330 | +10 to +20 |  |
|  | Second | +300 | +330 to +350 | +40 to +70 |  |
|  |  | −300 | −320 to −340 | +20 to +40 |  |
|  | Third | +300 | +330 to +350 | +50 to +70 |  |
|  |  | −300 | −310 to −330 | +20 to +30 |  |
| Device 2 | First | +300 | +400 to +430 | +90 to +110 | ≤5 |
|  |  | −300 | −180 to −220 | +100 to +120 |  |
|  | Second | +300 | +380 to +420 | +70 to +100 |  |
|  |  | −300 | −200 to −230 | +90 to +110 |  |
|  | Third | +300 | +390 to +430 | +90 to +110 |  |
|  |  | −300 | −190 to −220 | +100 to +120 |  |

REFERENCE SIGNS LIST

1 Machinable ceramic layer
2 Through hole
3 Power supply terminal
4 Adhesion activating layer
5 Electrode layer
6 Dielectric layer
7 DC power supply
8 Workpiece suction surface
10 Attachment and detachment device

The invention claimed is:

1. An attachment and detachment device enabling suction and separation of a workpiece, the device comprising:
a machinable ceramic layer;
an adhesion activating layer provided on the machinable ceramic layer;
an electrode layer provided on the adhesion activating layer; and
a dielectric layer provided on the electrode layer, wherein
the machinable ceramic layer comprises a machinable ceramic containing $SiO_2$,
the adhesion activating layer comprises a ceramic sprayed film containing an aluminum oxide,
the electrode layer is covered with the adhesion activating layer and the dielectric layer,
the dielectric layer has a volume resistivity at room temperature of $10^9$ to $10^{12}$ Ω·cm, and
the adhesion activating layer has a volume resistivity at room temperature of $10^9$ to $10^{12}$ Ω·cm or $10^{14}$ to $10^{16}$ Ω·cm.

2. The attachment and detachment device according to claim 1, wherein the workpiece has a thickness of 0.001 to 1.5 mm.

3. The attachment and detachment device according to claim 1, wherein the workpiece is any of a conductor, a semiconductor, or an insulator.

4. The attachment and detachment device according to claim 1, wherein the workpiece is any of a flake, foil, paper, or a film.

5. The attachment and detachment device according to claim 1, wherein the dielectric layer and/or the electrode layer includes a sealing hole.

6. The attachment and detachment device according to claim 1, wherein the adhesion activating layer includes a sealing hole.

7. The attachment and detachment device according to claim 1, wherein the electrode layer constitutes a unipolar electrode or a bipolar electrode to which voltages having different polarities are applied.

8. The attachment and detachment device according to claim 1, wherein the electrode layer includes a plurality of partitioned regions partitioned in an array.

9. The attachment and detachment device according to claim 2, wherein the workpiece is any of a conductor, a semiconductor, or an insulator.

10. The attachment and detachment device according to claim 2, wherein the workpiece is any of a flake, foil, paper, or a film.

11. The attachment and detachment device according to claim 1, wherein the dielectric layer comprises an aluminum oxide-based ceramic sprayed film.

12. The attachment and detachment device according to claim 1, wherein the electrode layer comprises a sprayed film comprising conductive ceramics or a metal sprayed film.

13. The attachment and detachment device according to claim 1, wherein the workpiece has a thickness of 0.001 to 0.3 mm.

14. The attachment and detachment device according to claim 1, wherein the adhesion activating layer has a volume resistivity at room temperature of $10^9$ to $10^{12}$ Ω·cm.

* * * * *